(12) United States Patent
Estes

(10) Patent No.: US 7,388,276 B2
(45) Date of Patent: Jun. 17, 2008

(54) METAL-INSULATOR VARACTOR DEVICES

(75) Inventor: Michael J. Estes, Longmont, CO (US)

(73) Assignee: The Regents of the University of Colorado, Boulder, CO (US)

( * ) Notice: Subject to any disclaimer, the term of this patent is extended or adjusted under 35 U.S.C. 154(b) by 0 days.

(21) Appl. No.: 11/176,404

(22) Filed: Jul. 7, 2005

(65) Prior Publication Data
US 2006/0267150 A1 Nov. 30, 2006

Related U.S. Application Data

(63) Continuation-in-part of application No. 11/113,587, filed on Apr. 25, 2005, now Pat. No. 7,173,275, which is a continuation-in-part of application No. 10/877,874, filed on Jun. 26, 2004, now Pat. No. 7,105,852, which is a continuation of application No. 10/347,534, filed on Jan. 20, 2003, now Pat. No. 6,756,649, which is a continuation of application No. 09/860,972, filed on May 21, 2001, now Pat. No. 6,563,185.

(60) Provisional application No. 60/586,493, filed on Jul. 8, 2004, provisional application No. 60/565,700, filed on Apr. 26, 2004.

(51) Int. Cl.
*H01L 29/93* (2006.01)

(52) U.S. Cl. .................. 257/595; 257/598; 257/E29.344

(58) Field of Classification Search .................. 257/595, 257/598, E29.344, 600, E27.049; 438/379
See application file for complete search history.

(56) References Cited

U.S. PATENT DOCUMENTS

| 4,272,641 A | 6/1981 | Hanak |
| 4,442,185 A | 4/1984 | Skotheim |
| 4,482,779 A | 11/1984 | Anderson |
| 4,510,516 A | 4/1985 | Bartelink |
| H667 H | 9/1989 | Bedair et al. |
| 4,973,858 A | 11/1990 | Chang |
| 4,980,312 A | 12/1990 | Harris et al. |
| 5,018,000 A | 5/1991 | Yamada et al. |
| 5,019,530 A | 5/1991 | Kleinsasser et al. |
| 5,302,838 A | 4/1994 | Roenker et al. |

(Continued)

OTHER PUBLICATIONS

John G. Simmons, *Electric Tunnel Effect between Dissimilar Electrodes Separated by a Thin Insulating Film*, Sep. 1993, Journal of Applied Physics, V34, p. 2581.

S. R. Pollack and C. E. Morris, *Electron Tunneling through Asymmetric Films of Thermally Grown $Al_2O_3$*, May 1964, Journal of Applied Physics, V35, N5, p. 1503-1513.

L. O. Hocker, D. R. Sokoloff, V. Daneu, A. Szoke, and A. Javan, *Frequency Mixing in the Infrared and Far-Infrared using a Metal-to-Metal Point Contact Diode*, Jun. 15, 1968, American Institute of Physics, V 12, N 12, p. 401-402.

(Continued)

*Primary Examiner*—T. N. Quach
(74) *Attorney, Agent, or Firm*—Pritzkau Patent Group, LLC

(57) ABSTRACT

A varactor is configured with first and second conducting layers, spaced apart from one another such that a given voltage can be applied across the first and second conducting layers. Further, an insulator arrangement includes at least one insulator layer disposed between the first and second conducting layers, configured to cooperate with the first and second conducting layers to produce a charge pool which changes responsive to changes in the given voltage such that a device capacitance value between the first and second conducting layers changes responsive to the given voltage. The insulator arrangement can include one layer, two distinct layers or more than two distinct layers. One or more of the layers can be an amorphous material. A zero-bias voltage version of the varactor is also described.

12 Claims, 5 Drawing Sheets

U.S. PATENT DOCUMENTS

| | | | |
|---|---|---|---|
| 5,326,984 | A | 7/1994 | Rosencher et al. |
| 5,455,451 | A | 10/1995 | Usagawa et al. |
| 5,514,904 | A * | 5/1996 | Onga et al. .................. 257/627 |
| 5,543,652 | A | 8/1996 | Ikeda et al. |
| 5,606,177 | A | 2/1997 | Wallace et al. |
| 5,621,222 | A | 4/1997 | Kimura |
| 5,675,295 | A | 10/1997 | Brebels et al. |
| 5,796,119 | A | 8/1998 | Seabaugh |
| 5,825,049 | A | 10/1998 | Simmons et al. |
| 5,825,240 | A | 10/1998 | Geis et al. |
| 5,883,549 | A | 3/1999 | De Los Santos |
| 5,895,934 | A | 4/1999 | Harvey et al. |
| 5,994,891 | A | 11/1999 | Hubbell |
| 6,049,308 | A | 4/2000 | Hietala et al. |
| 6,077,722 | A | 6/2000 | Jansen et al. |
| 6,107,562 | A | 8/2000 | Hashimoto et al. |
| 6,110,393 | A | 8/2000 | Simmons et al. |
| 6,121,541 | A | 9/2000 | Arya |
| 6,195,485 | B1 | 2/2001 | Coldren et al. |
| 6,211,531 | B1 | 4/2001 | Nakazato et al. |
| 6,284,557 | B1 | 9/2001 | Yiu et al. |
| 6,329,655 | B1 | 12/2001 | Jack et al. |
| 6,534,784 | B2 | 3/2003 | Eliasson et al. |
| 6,563,185 | B2 | 5/2003 | Moddel et al. |
| 6,756,649 | B2 * | 6/2004 | Moddel et al. .............. 257/425 |
| 7,126,151 | B2 * | 10/2006 | Estes et al. .................... 257/25 |

OTHER PUBLICATIONS

S. M. Faris, T. Kenneth Gustafson, and John C. Wiesner, *Detection of Optical Infrared Radiation with DC-Biased Electron-Tunneling Metal-Barrier-Metal Diodes*, Jul. 1973, IEEE Journal of Quantum Electronics, V QE-9, N 7, p. 737-745.
C. Fumeaux, W. Herrmann, F. K. Kneubuhl, and H. Rothuizen, *Nanometer Thin-Film Ni-NiO-Ni Diodes for Detection and Mixing of 30 THz Radiation*, Jul. 1998, Infrared Physics and technology, V 39, 123-183.
B. Michael Kale, *Electron Tunneling Devices in Optics*, Mar. 1985, Optical Engineering, V 24, N 2, p. 267-274.
G. Papp, M. DiVentra, C. Coluzza, A. Baldereschi, and G. Margaritondo, *Current Rectification through a Single-Barrier Resonant Tunneling Quantum Structure*, 1995, Superlattices and Microstructures, V 17, N 3, p. 273-275.
Alexander Korotkov and Konstantin Likharev, *Resonant Fowler-Nordheim Tunneling through Layered Tunnel Barriers and its Possible Applications*, Mar. 1999, International Electron Device Meeting Technical Digest.
T. Suemasu et al, *Metal ($CoSi_2$)/Insulator ($CaF_2$) Resonant Tunneling Diode*, Jan. 1994, Jpn. Journal of Applied Physics, V 33, p. 57-65.
M. Asada, K. Osada, and W. Saitoh, *Theoretical Analysis and Fabrication of Small Area Metal/Insulator Resonant Tunneling Diode Integrated with Patch Antenna for Terahertz Photon Assisted Tunneling*, 1998, Solid State Electronics, V 42, N7-8, p. 1543-1546.
Aleksanyan et al, *Feasibility of Developing a Tunable Oscillator Utilizing a System of Metal-Barrier-Metal-Barrier-Metal Junctions*, May 1981, Sov. J. Quantum Electron, vol. 11, No. 5, pp. 635-637.
Aleksanyan et al, *Generation of Electromagnetic Oscillations in Metal-Barrier-Metal-Barrier-Metal Structures*, Aug. 1982, Sov. J. Quantum Electron., vol. 12, No. 8, pp. 1090-1092.
Belenov et al, *Amplification of Plasma Oscillations in Complex Metal-Barrier-Metal Structures*, Jul. 1982, Sov. J. Quantum Electron., vol. 12, No. 7, pp. 930-931.
Belenov et al, *Investigation of the Radiation Emitted by Metal-Barrier-Metal Structures*, Apr. 1983, Sov. J. Quantum Electron., vol. 13, No. 4, pp. 451-455.
Belenov et al, *Angular Distribution of the Luminescence Emitted by a Metal-Barrier-Metal Diode*, May 1985, Sov. J. Quantum Electron., vol. 15, No. 5, pp. 735-737.
Belenov et al, *Resonant Tunneling in Multilayer Structures in the Presence of Surface Electromagnetic Waves*, Apr. 1986, Sov. Tech. Phys. Lett., vol. 12, No. 4, pp. 200-202.

Belenov et al, *Emission of Surface Electromagnetic Waves in the Case of Resonance Tunneling of Electrons*, Oct. 1987, Sov. J. Quantum Electron., vol. 17, No. 10, pp. 1348-1352.
Bykovskii et al, *Influence of the Boundary of a Metal Film on the Luminescence Intensity from a Metal-Barrier-Metal Structure*, Sov. Phys. Tech. Phys., Aug. 1986, vol. 31, No. 8, pp. 980-981.
Simon M. Sze, *Physics of Semiconductor Devices*, John Wiley & Sons, 2nd edition, 1981, Chapter 14.
J. Kuendig et al., *Thin-film silicon solar cells for space applications: Radiation hardness and applications for an integrated SOLANT (Solar cell—Antenna) module*, 28th IEEE Photovoltaic Specialists Conference, Anchorage, Alaska, Sep. 2000.
G. Ghione and C. Naldi, "Analytical formulas for coplanar lines in hybrid and monolithic MIC's," Electron. Lett., vol. 20, pp. 179-181 (1984).
Tae-Whan Yoo and Kai Chang, "Theoretical and experimental development of 10 and 35 GHz rectennas," IEEE Transactions on Microwave Theory and Techniques, vol. 40, No. 6, pp. 1259-1266 (1992).
Ashok Agrawal and Walter E. Powell, "Monopulse printed circuit dipole array," IEEE Transactions on Antennas and Propagation, vol. AP-33, No. 11, pp. 1280-1283 (1985).
Yu-De Lin and Syh-Nan Tsai, "Coplanar waveguide-fed uniplanar bow-tie antenna," IEEE Transactions on Antennas and Propagation, vol. 45, No. 2, pp. 305-306 (1997).
C. Fumeaux, W. Herrmann, F.K. Kneubühl, H. Rothuizen, B. Lipphardt, and C.O. Weiss, "Nanometer thin-film Ni-NiO-Ni diodes for mixing 28 THz $CO_2$-laser emissions with difference frequencies up to 176 GHz," Appl. Phys. B, vol. 66, pp. 327-332 (1998).
D.B. Rutledge, D.P. Neikirk and D.P. Kasilingam, "Integrated-Circuit Antennas," *Infrared and Millimeter Waves*, Kenneth J. Button, ed., vol. 10, Academic Press, pp. 24-27, 74-81 (1983).
David B. Rutledge and Michael S. Muha, "Imaging antenna arrays," IEEE Transactions on Antennas and Propagation, vol. AP-30, No. 4, pp. 535-540 (1982).
C. A. Mead, "Tunnel-Emission Amplifiers," Proc. IRE, 48, 359 (1960).
Mordehai Heiblum, "Tunneling Hot Electron Transistor Amplifiers (THETA): Amplifiers Operating Up to the Infrared," Solid State Elec., 24, 343 (1981).
S. Muratake, M. Watanabe, T. Suemasu, and M. Asada, "Transistor action of metal (CoSi2)/insulator (CaF2) hot electron transistor structure," Elec. Lett., 28, 1002 (1992).
M. Heiblum, M. I. Nathan, D. C. Thomas, and C. M. Knoedler, "Direct Observation of Ballistic Transport in GaAs," Phys. Rev. Lett., 55, 2200 (1985).
A. Seabaugh, Y-C.Kao, J. Rndall, W. Frensely, A.Khatibzadeh, "Room Temperature Hot Electron Transistors with InAs-Notched Resonant-Tunneling-Diode Injector," Japanese Journal of Appl. Phys., 30, 921 (1991).
D. Lacour, M. Hehn, F. Montaigne, H. Jaffres, P. Rottlander, G. Rodaray, F.Ghuyen Van Dau, F. Petroff, A. Schuhl, "Hot-electron transport in 3-terminal devices based on magnetic tunnel junctions,"Europhysics Letters, 60, 896 (2002).
Satoshi Sugahara, Masaaki Tanaka, "Spin-Filter Transistor," Japanese Journal of Applied Physics, 43, L838 (2004).
John G. Simmons, "Generalized Formula for the Electric Tunnel Effect Between Similar Electrodes Separated by a Thin Insulating Film," J. Appl. Phys., 34, 1793 (1963).
R. Ludeke, H. J. Wen, and Andreas Schenk, "Quantum interference in SiO2: A conduction-band mass reappraisal," Appl. Phys. Lett., 73, 1221 (1998).
M. Heiblum, K. Seo, H.P. Meier, T.W. Hickmott, "First Observation of Ballistic Holes in a p-Type THETA Device," IEEE Trans. On Electron Devices, 35, 2428 (1988).
A. Otto, "Controlling a tunnel current from the exterior: A new mesoscopic quantum effect," *Europhysics Letters*, 62, 398 (2003).
Blake Eliasson, Metal-Insulator-Metal Diodes for Solar Energy Conversion, Doctorial Theses, University of Colorado, 2001.
Richard Bronson, Schaum's Online of Modem Introductory Differential Equations, McGraw Hill, 1973, Chapter 32, pp. 201-202.

* cited by examiner

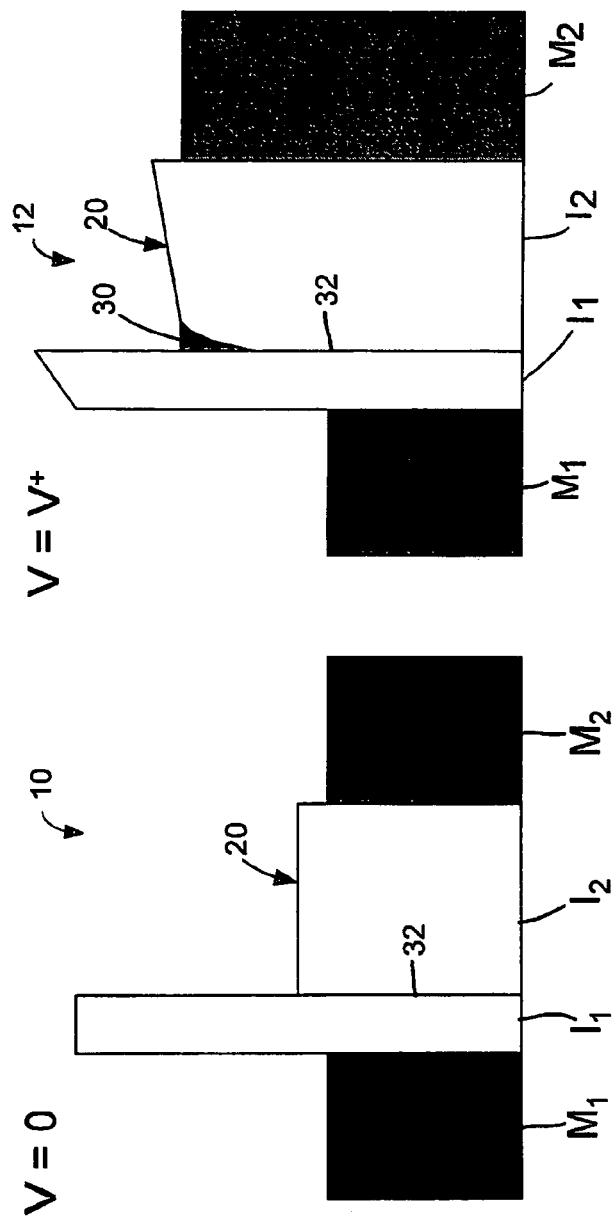
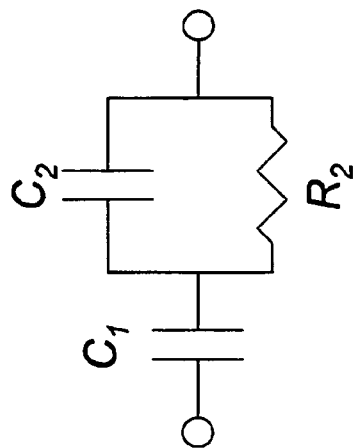

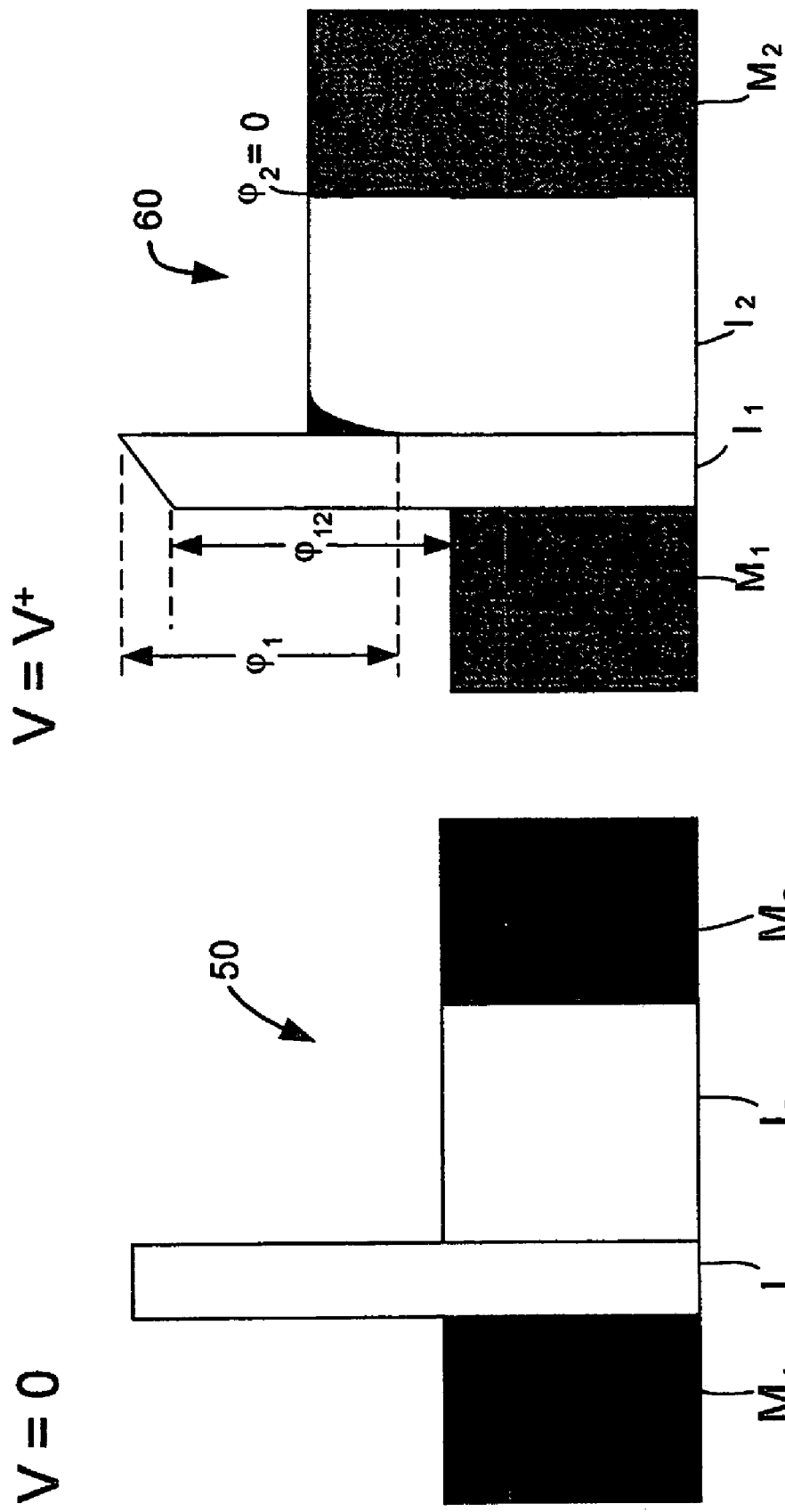

$V = 0$ $V = V^+$ $V = 0$ $V = V^+$

METAL-INSULATOR VARACTOR DEVICES

RELATED APPLICATIONS

The present application is a Continuation-in-Part of U.S. patent application Ser. No. 11/113,587 entitled, THIN-FILM TRANSISTORS BASED ON TUNNELING STRUCTURES AND APPLICATIONS, filed on Apr. 25, 2005, U.S. Pat. No. 7,173,275 and also claims priority from U.S. Provisional Application Ser. No. 60/586,493 entitled METAL-INSULATOR VARACTOR DEVICES, filed on Jul. 8, 2004. The application Ser. No. 11/113,587 is itself a Continuation-in-Part of U.S. patent application Ser. No. 10/877,874, entitled HIGH SPEED ELECTRON TUNNELING DEVICES, filed on Jun. 26, 2004, U.S. Pat. No. 7,105,852 and which also claims priority from U.S. Provisional Application Ser. No. 60/565,700, filed Apr. 26, 2004 entitled PRACTICAL THIN-FILM TRANSISTORS BASED ON METAL-INSULATOR TUNNELING STRUCTURES AND THEIR APPLICATIONS. The application Ser. No. 10/887,874 is itself a Continuation of U.S. patent application Ser. No. 10/347,534, entitled HIGH SPEED ELECTRON TUNNELING DEVICES, filed on Jan. 20, 2003, U.S. Pat. No. 6,756,649 which is itself a Continuation of U.S. patent application Ser. No. 09/860,972, entitled HIGH SPEED ELECTRON TUNNELING DEVICE AND APPLICATIONS, filed on May 21, 2001, U.S. Pat. No. 6,563,185 all of which are incorporated herein by reference in their entirety.

BACKGROUND OF THE INVENTION

An electronic component that varies in capacitance, responsive to a bias voltage, is used in many modern-day electronic designs and is likely to be of continuing utility for the foreseeable future. Such devices are often referred to as "varactors". High speed varactors (i.e.—varactors whose capacitance can change very quickly with high frequency changes in voltage) find use as low-loss frequency multipliers as well as tuning elements in high-frequency circuits.

The state-of-the-art in the design of a varactor typically employs semiconductor materials to produce a p-n junction that is biased so as to vary the capacitance of the junction. While the use of a semiconductor-based design has been effective for its intended purpose, the present application discloses a new design which is intended to provide significant advantages over the use of a typical prior art p-n junction design, for example, with respect to device speed, as well as providing still further advantages.

BRIEF DESCRIPTION OF THE DRAWINGS

The present invention may be understood by reference to the following detailed description taken in conjunction with the drawings briefly described below. It is noted that, for purposes of illustrative clarity, certain elements in the drawings may not be drawn to scale. Furthermore, descriptive nomenclature such as, for example, vertical, horizontal and the like applied to the various figures is used for illustrative purposes only and is in no way intended as limiting useful orientations of the structure or device described.

FIGS. 1a and 1b are energy band diagrams for a MIIM device of the present invention, showing an unbiased and a biased state, respectively.

FIG. 2b is a plot of charge against lateral distance for the biased device of FIG. 2a.

FIG. 2c is a plot of electric field strength against lateral distance for the biased device of FIG. 2a.

FIGS. 4a and 4b are energy band diagrams for a MIIM device of the present invention, showing an unbiased and a biased state, respectively, wherein the device is configured for use without a need for a zero bias voltage.

FIG. 7 is a schematic diagram of a small signal model derived from the MIIM device structure.

SUMMARY OF THE INVENTION

Figure 2A:
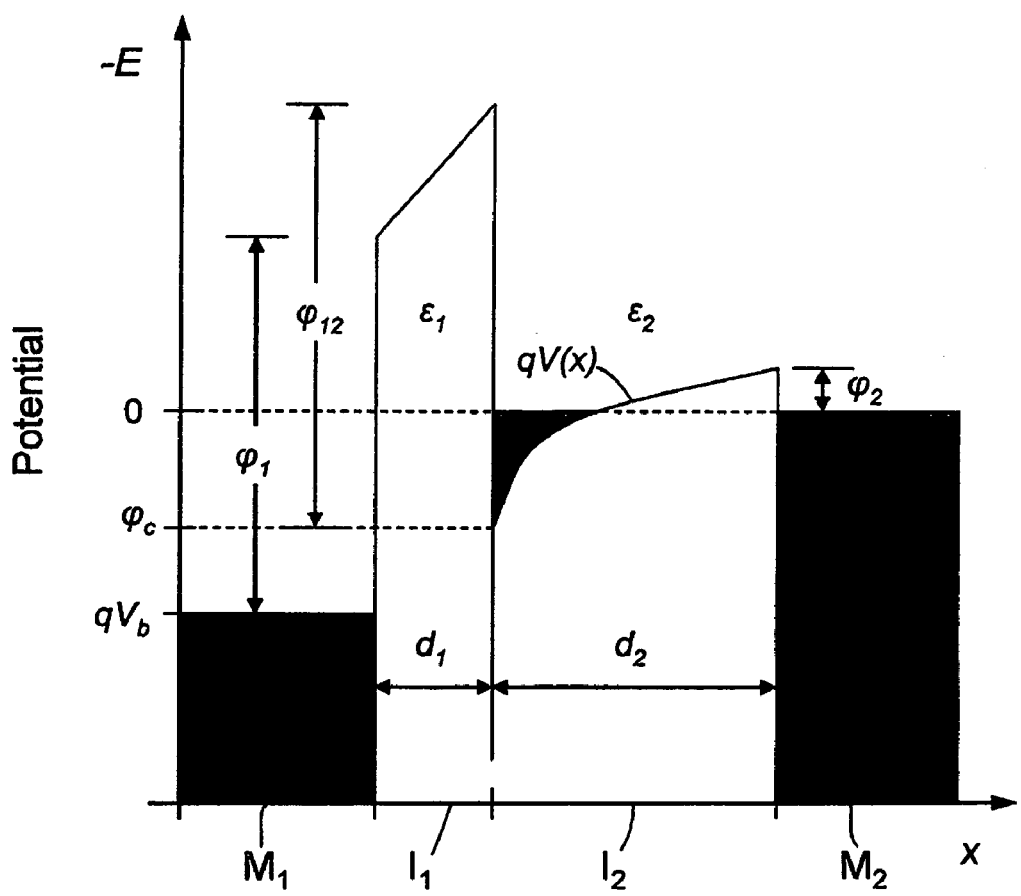
FIG. 2a is an energy band diagram for the MIIM device of FIGS. 1a and 1b, shown here to illustrate further details with respect to the biased state.

As will be described in more detail hereinafter, there is disclosed herein, a highly advantageous varactor and associated method.

In one aspect of the invention, the varactor is configured with first and second conducting layers, spaced apart from one another such that a given voltage can be applied across the first and second conducting layers. Further, an insulator arrangement includes at least one insulator layer disposed between the first and second conducting layers, configured to cooperate with the first and second conducting layers to produce a charge pool therein which changes responsive to changes in the given voltage such that a device capacitance value between the first and second conducting layers changes responsive to the given voltage.

In one feature, the insulator arrangement includes at least two distinct layers.

In another feature, the insulator arrangement includes a single layer of material.

In a related feature, at least one of the layers of the insulator is an amorphous material.

In another aspect of the present invention, a MIIM device can be configured to set a threshold bias voltage, at least approximately, to zero volts so as to provide for use of the varactor without a need for a bias voltage.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Further, like reference numbers are applied to like components, whenever practical, throughout the present disclosure.

Disclosed is a highly advantageous metal-insulator device structure forming a variable capacitor (hereinafter varactor) in which the capacitance of the 2-terminal device varies as a function of voltage across the device. The disclosed varactor has several advantages over competing semiconductor-based varactors, including:

1. Large change in capacitance;
2. High capacitance per unit area;
3. High differential capacitance; and
4. Compatibility with a wide variety of substrate materials.

In one implementation, the basic varactor of this disclosure has a structure of metal-insulator-insulator-metal (MIIM) of the type originally disclosed by Eliasson and Moddel in U.S. Pat. No. 6,534,784 (hereinafter, the '784 patent) which is incorporated herein by reference in its entirety and commonly owned with the present application. In this regard, it should be appreciated that the device of the '784 patent was specifically directed to solar energy conversion.

Turning now to FIGS. 1a and 1b, energy band diagrams for an MIIM varactor are illustrated and generally indicated by the reference numerals 10 and 12, respectively. FIG. 1a shows the device at zero bias, indicated as V=0, while FIG. 1b shows the device under positive applied bias voltage (forward bias), indicated as V=V$^+$. In these figures, a first metal layer M$_1$ and a second metal layer M$_2$ are positioned in a spaced-apart relationship. An insulator arrangement 20 is disposed between first and second metal layers M$_1$ and M$_2$. In the present example, insulator arrangement 20 includes a first insulator layer I$_1$ and a second insulator layer I$_2$. What distinguishes the varactor devices of this disclosure from the MIIM tunneling devices of the '784 patent resides in causing the device to function as a capacitor, as opposed to a nonlinear resistor or diode. In the MIIM diodes of the '784 patent, insulator materials and thicknesses are chosen to allow electrons to tunnel across the device from one metal to the other. It is noted that this unexpected and surprising behavior was discovered in conjunction with device characterization and design using complex modeling techniques that were directed toward development of non-linear devices. With this remarkable discovery in hand, modifications were made, which are considered as neither trivial or obvious, in causing the MIIM structure to function in a completely different way and as a completely different kind of device. In particular, first insulator I$_1$ is configured to have a very high barrier height (>>1 eV) and second insulator I$_2$ to have a low barrier height (nominally<0.3 eV). Thus, it is recognized that electrons from the second metal (M$_2$) may readily tunnel across I$_2$ but not across I$_1$. Under forward bias, therefore, free electron charge pools up in a generally triangular potential well 30, between the two insulators. More specifically, potential well 30 is formed in I$_2$ proximate to a boundary 32 between I$_1$ and I$_2$. It is further recognized that this charge pooling causes a change in capacitance that is dependent on an applied voltage, forming a varactor device.

In the following sections, a theoretical calculation of capacitance, for the MIIM varactor of FIGS. 1a and 1b, is described as a function of (i) applied voltage, (ii) C(V), (iii) alternative varactor configurations and (iv) factors affecting varactor frequency response and performance.

Theory—Calculating C(V)

It is noted that the following analysis is presented with the intention of enhancing the readers' understanding, however, there is no intention to be bound by the theoretical concepts that are presented.

Figure 2B:
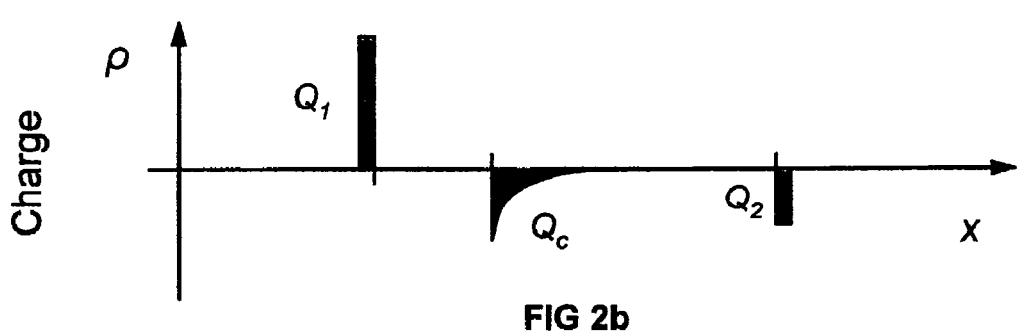
Figure 2C:
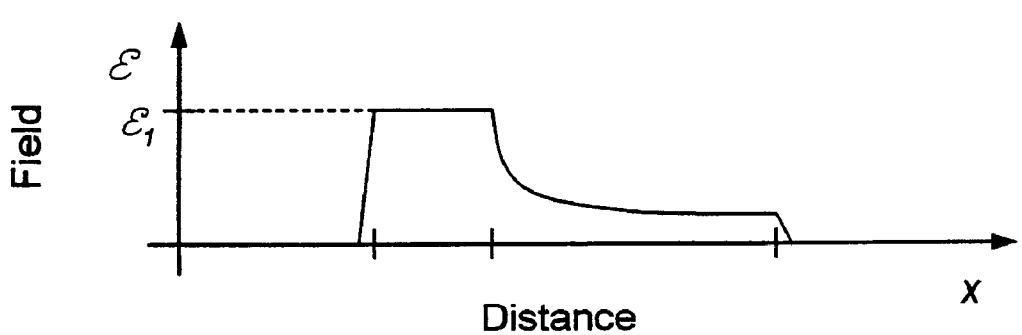

Turning to FIGS. 2a-c, to understand the operation of the MIIM varactor and to estimate the capacitance as a function of applied voltage, one may start by solving the electrostatics problem of charge and field distribution that is illustrated. FIGS. 2a-c are plots against distance x, of potential E, charge ρ, and electric field intensity ε, respectively. We start with a MIIM structure including aforedescribed M$_1$, I$_1$, I$_2$, and M$_2$, having a first (higher) I$_1$ barrier of thickness d$_1$, electron affinity $\chi_1$, and dielectric constant $\epsilon_1$, and a second (lower) I$_2$ barrier of thickness d$_2$, electron affinity $\chi_2$, and dielectric constant $\epsilon_2$. These barriers are bounded by metal M$_1$ on the left side with work function $\Phi_{M1}$, and metal M$_2$ on the right side with work function $\Phi_{M2}$. The barrier heights shown in FIG. 2, which are all taken as positive numbers, are given by $$\phi_1 = \chi_1 - \Phi_{M1} \tag{1}$$

$$\phi_2 = \chi_2 - \Phi_{M2} \tag{2}$$

$$\phi_{12} = \chi_2 - \chi_1 \tag{3}$$

Finally, we apply a voltage across M$_1$ and M$_2$ of the MIIM having magnitude V$_b$. For this analysis we make several significant assumptions. First, we assume that the first (higher) barrier is high enough and/or wide enough that electron tunneling through it is negligible. Otherwise, we have to account for tunneling rates between first metal M$_1$ and the charge pool and between the charge pool and second metal M$_2$. In such a three level system, the electron density and quasi-Fermi energy of the charge pool will vary as the tunneling rates vary, a complication we will avoid for this initial analysis. Similarly, we assume that the free charge density in the first barrier is completely negligible. Second, we assume that the density of states in the second (lower) barrier material is not modified by quantum mechanical reflections. In other words, we neglect quantum confinement and the formation of a triangular quantum well. This assumption is likely accurate, since typical barrier materials would be amorphous oxides, where lack of long-range electron coherence would likely destroy any quantum confinement effects. Third, despite the amorphous nature of these barriers, we will neglect band tail states in the density of states and simply use a parabolic band model with an effective electron mass of unity, where the density of states is given by $$N(E) = \frac{1}{2\pi^2} \left( \frac{2m}{\hbar^2} \right)^{3/2} E^{1/2}, \tag{4}$$

where h is Planck's constant, m is the electron mass and E is the energy above the conduction band edge.

To calculate the free electron charge density at any point x in the second (lower) I$_2$ barrier, all we need to know is the potential, V(x), of the barrier. The charge density is then $$n(V) = \int_{-qV(x)}^{\infty} N(E)f(E)dE \tag{5}$$

$$= \frac{1}{2\pi^2} \left( \frac{2m}{\hbar^2} \right)^{3/2} \int_{-qV(x)}^{\infty} \frac{(qV(x)+E)}{e^{E/kT}+1} dE$$

where f(E) is the Fermi distribution of electrons. Note that we have used the energy convention shown in FIG. 2a, where the Fermi level of the first metal is taken as zero, and potential energy E increases positively as we move down the vertical axis. Knowing the charge density in barrier I$_2$ as a function of potential, we can use the Poisson equation, with appropriate boundary conditions, to solve for a potential distribution, V(x), a charge density in the barrier I$_2$, Q$_c$, and the charge densities at the two metal interfaces, Q$_1$ and Q$_2$. It is noted that FIG. 2b plots charge density as a function of x, in order to illustrate these various charge density values.

From the bias voltage dependence of the anode $M_1$ charge, $Q_1(V_b)$, we may then calculate capacitance as $dQ_1/dV_b$.

The Poisson relationship for charge and potential in barrier $I_2$ is thus given by $$\frac{d^2V}{dx^2} = -\frac{\rho}{\varepsilon} = -\frac{qn(V)}{\varepsilon_2}. \quad (6)$$

Multiplying both sides of Equation 6 above by $2 \cdot dV/dx$, we obtain $$\frac{d^2V}{dx^2}\left(2\frac{dV}{dx}\right) = -\frac{q}{\varepsilon_2}n(V)\left(2\frac{dV}{dx}\right). \quad (7)$$

Integrating both sides, we obtain $$\left(\frac{dV}{dx}\right)^2 = -2\frac{q}{\varepsilon_2}\int n(V(x))\left(\frac{dV}{dx}\right)dx \quad (8)$$

$$= -2\frac{q}{\varepsilon_2}\int n(V)dV$$

$$= -2\frac{q}{\varepsilon_2}\int_{-\infty}^{V} n(V)dV + C$$

Now, using boundary conditions at the $I_2$-$M_2$ interface, we may solve for the integration constant, C. We will call this point (i.e., the $I_2$-$M_2$ interface) x=0 and use the convention that x increases positively towards the left in the view of FIGS. 2a-c and towards $I_1$. We know the potential at x=0: it is simply $-\phi_2$. If we assume that $\phi_2 \gg kT$ so that the charge density at this point is negligible, then the electric field at x=0 is given by $Q_2/\varepsilon_2$. Our boundary conditions at x=0 are then $$V(0) = -\phi_2 \quad (9)$$

$$V'(0) = \frac{Q_2}{\varepsilon_2} \quad (10)$$

With these boundary conditions, the integration constant becomes $$C = \left(\frac{Q_2}{\varepsilon_2}\right)^2 + 2\frac{q}{\varepsilon_2}\int_{-\infty}^{-\phi_2} n(V)dV. \quad (11)$$

The expression for electric field is then $$\frac{dV}{dx} = \sqrt{\left(\frac{Q_2}{\varepsilon_2}\right)^2 + 2\frac{q}{\varepsilon_2}\int_{V}^{-\phi_2} n(V)dV}. \quad (12)$$

Since the Poisson equation is a highly nonlinear second order differential equation, we must use numerical methods to solve for V(x) and $Q_c$. Since we know dV/dx, the well-known Taylor Method works well (See, for example, Schaum's Outline of Theory and Problems of Differential Equations, McGraw Hill (1973), which is incorporated herein by reference). We break up the second barrier into finite elements along the x-axis. Starting at x=0, where we know V(x) and V'(x), we can then work towards x=$d_2$. We must assume a value for $Q_2$ to start the process. Later, we will use boundary conditions to find the correct value of $Q_2$ for the given bias voltage. Using Taylor's method, successive values of the potential are given by $$V_{n+1} = V_n + hV_n' + \frac{h^2}{2}V_n'' \quad (13)$$

$$= V_n \pm h\sqrt{\left(\frac{Q_2}{\varepsilon_2}\right)^2 + 2\frac{q}{\varepsilon_2}\frac{1}{2\pi^2}\left(\frac{2m}{\hbar^2}\right)^{3/2}\int_{V_n}^{-\phi_2} n(V_n)dV} -$$

$$\frac{h^2}{2}\frac{q}{\varepsilon_2}n(V_n)$$

where h is the finite element width (dx) and the ± is determined by the slope of V(x). If V'(x)>0, the sign is negative, otherwise the sign is positive.

Having solved for V(x) from our assumed value of $Q_2$, we can now solve for $Q_c$ as $$Q_c = q\int_0^{d_2} n(V(x))dx. \quad (14)$$

The boundary condition that enables us to solve for the correct value of $Q_2$ for a given bias voltage is given by $$Q_c = -Q_2 - Q_1 \quad (15)$$

$$= -Q_2 - \varepsilon_1\frac{dV}{dx}\bigg|_{M1 interface}$$

$$= -Q_2 - \varepsilon_1\frac{V_b + \phi_{12} - \phi_c - \phi_1}{d_1}$$

where $\phi_c = V_{nmax}$. To solve for $Q_2(V_b)$, we can equate the two previous equations for $Q_c$ and solve for $Q_2$.

Having now found $Q_2(V_b)$, we can insert this back into Equation 15 for $Q_1$ to find $Q_1(V_b)$. Finally, the differential capacitance of the MIIM is found by $$C_{MIIM}(V) = \frac{dQ_1}{dV}. \quad (16)$$

Figure 3:
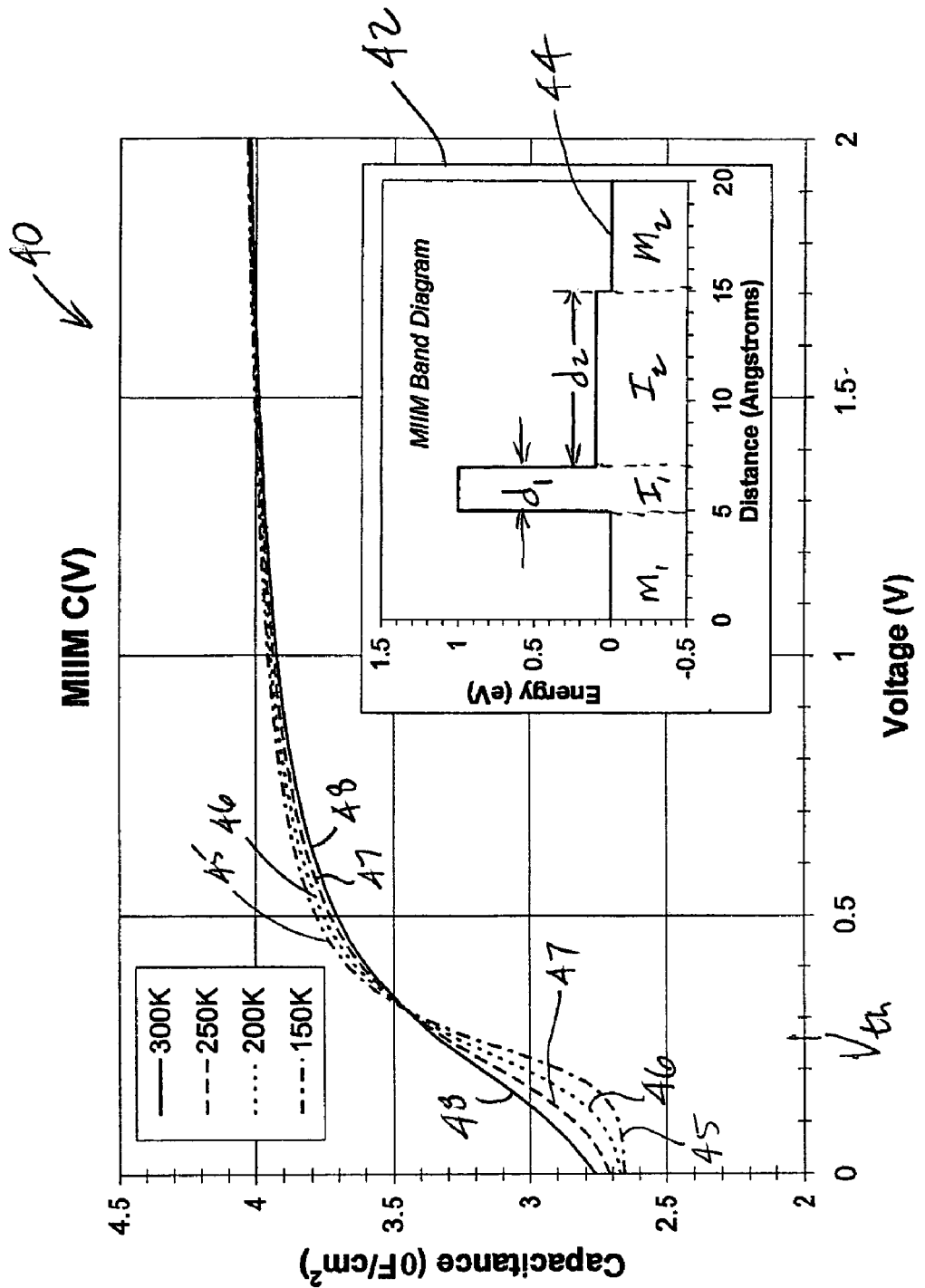
FIG. 3 includes a plot of capacitance against bias voltage for an exemplary MIIM varactor device that is produced in accordance with the present invention, including an inset plot of an energy band diagram of this exemplary MIIM.

FIG. 3 includes a coordinate system, generally indicated by the reference number 40, showing capacitance plotted against voltage for a given MIIM device. An inset coordinate system 42 illustrates an energy band diagram 44 showing energy in electron volts versus distance in angstroms for the given MIIM device in which: $d_1$=2 nm, $d_2$=8 nm, $\varepsilon_1$=10$\varepsilon_0$, $\varepsilon_2$=60$\varepsilon_0$, $\phi_1$=1.0 eV, $\phi_2$=0.1 eV and $\phi_{12}$=0.9 eV. Plots are provided for four different temperatures: 150° K., 200° K., 250° K. and 300° K., indicated by the reference numbers 45, 46, 47 and 48, respectively.

In view of FIG. 3, a general trend is clear. At negative bias voltages, and at voltages below the threshold voltage, $V_{th}$, the capacitance of the MIIM approaches the geometric capacitance of two dielectrics in series, $I_1$ and $I_2$. Above threshold, the capacitance approaches that of the first (higher) $I_1$ barrier alone. As temperature decreases towards T=0 K, the varactor switches between these two capacitance values more and more abruptly. The threshold voltage is the positive applied voltage at which the insulator well is at the Fermi energy level of $M_2$ and is given by $$V_{th} = \frac{d_1}{\varepsilon_1}\left(\frac{\varepsilon_2}{d_2}\phi_2 - \frac{\varepsilon_1}{d_1}\phi_{12} + \frac{\varepsilon_1}{d_1}\phi_1\right) \tag{17}$$

For the MIIM structure of FIG. 3, $V_{th}$ is approximately 0.25 V. In some practical applications, it may be advantageous to have $V_{th}$=0 so that the maximum change in capacitance occurs at zero bias and no bias supply is required, as will be described in further detail immediately hereinafter.

Attention is now directed to FIGS. 4a and 4b, which are energy band diagrams that are generally indicated by the reference numbers 50 and 60, respectively, for a highly advantageous "zero-bias" MIIM device wherein $V_{th}$ is moved to zero volts such that no bias supply voltage is needed in order to operate the varactor. FIG. 4a illustrates the energy band configuration with a bias of V=0, while FIG. 4b illustrates the energy band configuration for a bias of V=V+. In order to accomplish this, $\phi_2$ is set to equal zero by choosing $\Phi_{M2}=\chi_2$. That is, the work function of $M_2$ is equal to the electron affinity $\chi_2$ of $I_2$. This change can be seen clearly by comparing FIG. 4b with FIG. 2a, since FIG. 2a illustrates a nonzero value of $\phi_2$. Further, $\phi_1$ is set to equal $\phi_{12}$, as is shown in FIG. 4b.

From the foregoing analysis and in consideration of all of the aforedescribed devices and examples, we see that to maximize the capacitance swing, we must choose the first barrier $I_1$ layer to be very thin and very high and the second barrier layer $I_2$ to be fairly wide and low. It may be advantageous to have $\varepsilon_2 \ll \varepsilon_1$, where possible, in order to distribute the electric field more strongly in favor of the charge storage region. Of course, practical limitations on materials and on device speed (discussed below) will bound the achievable performance.

Alternative Varactor Configurations

It should be appreciated that alternative metal-insulator varactor structures are contemplated and the present invention is not limited to the aforedescribed MIIM structure. Such alternative structures will be described immediately hereinafter.

Figure 5A:
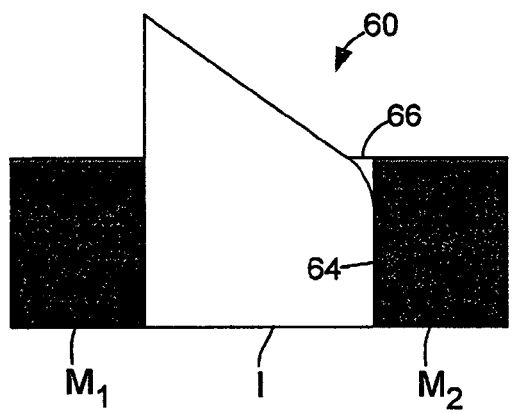
FIGS. 5a and 5b are energy band diagrams for a first alternative MIM device of the present invention, showing an unbiased and a biased state, respectively.
Figure 5B:
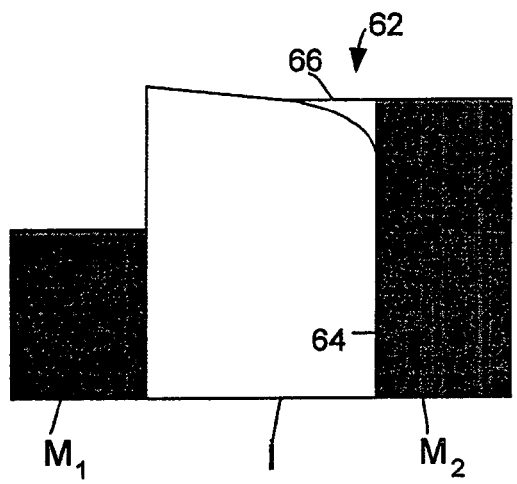

Attention is now directed to FIGS. 5a and 5b which illustrate energy band diagrams of a metal-insulator-metal (MIM) varactor at a bias of V=0, generally indicated by the reference number 60 and at a bias of V=V+, generally indicated by the reference number 62. First and second metal layers are indicated as $M_1$ and $M_2$, respectively, while an insulator is indicated as I. In producing the MIM varactor, a negative barrier height is formed by selecting electron affinity $\chi$ of insulator I and metal $M_2$, having work function $\Phi_{M2}$ such that $$\chi > \Phi_{M2} \tag{18}$$

Accordingly, a negative barrier height is produced at a boundary 64 between insulator I and metal $M_2$. In this MIM structure, the negative barrier between insulator I and metal $M_2$ forms a charge well 66 whose width is modulated by the applied voltage, as can be seen by comparing FIGS. 5a and 5b, resulting in a change in capacitance responsive to the applied voltage.

Figure 6A:
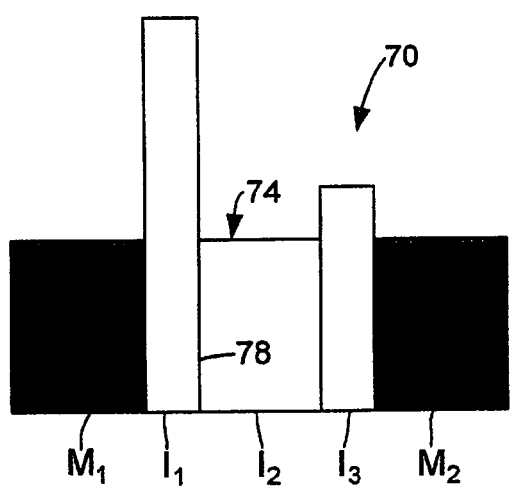
FIGS. 6a and 6b are energy band diagrams for a second alternative MIIIM device of the present invention, showing an unbiased and a biased state, respectively.
Figure 6B:
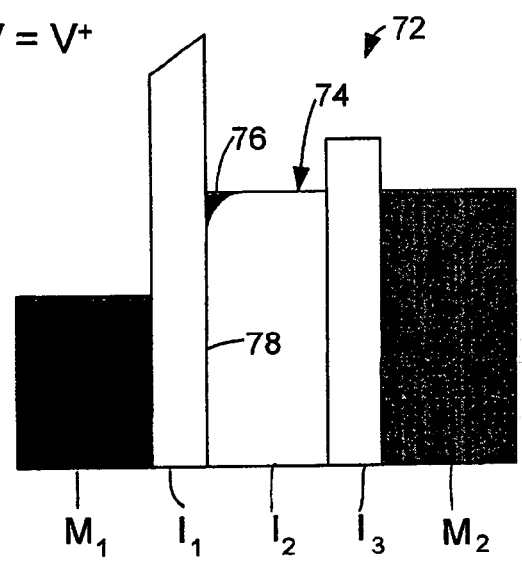

Another alternative varactor structure is illustrated by FIGS. 6a and 6b, showing energy band diagrams of a metal-insulator-metal (MIIIM) varactor at a bias of V=0, generally indicated by the reference number 70 and at a bias of V=V+, generally indicated by the reference number 72. First and second metal layers are indicated as $M_1$ and $M_2$, respectively, while an insulator layer arrangement is indicated as 74, including a first insulator layer $I_1$, a second insulator layer $I_2$ and a third insulator layer $I_3$. The device is configured to produce a charge well 76, in $I_2$, proximate to a boundary 78 between $I_1$ and $I_2$. It is noted that the device of FIGS. 6a and 6b is representative of a zero bias device. Since the MIIIM structure is quite similar in operation and spirit with respect to the MIIM varactor, a detailed analysis will not be provided for purposes of brevity. Moreover, it is believed that one having ordinary skill in the art can readily produce the MIIIM device in view of the foregoing descriptions.

Frequency Response and Performance

The speed or frequency response of the varactors described herein will be determined by how fast charge can be transferred in and out of the charge pool. In the discussion that follows, we will confine ourselves to the MIIM varactor structure, although it is believed that alternative structures will be well understood with this discussion in hand.

Referring again to FIGS. 1a and 1b, as increasing positive voltage is applied to the varactor, electrons fill charge pool 30 by tunneling from metal $M_2$. As the voltage is decreased again, excess charge drains from the pool by two processes: 1) tunneling back into metal $M_2$; and 2) band transport across the conduction band of insulator $I_2$ back into metal $M_2$. The speed at which these electrons may transport back and forth between the charge pool and metal $M_2$ determines the frequency response of the varactor.

If we ignore band transport across insulator $I_2$, which would be excessively slow for the case of an amorphous insulating material, we may calculate tunneling currents between the charge pool and metal $M_2$ using existing tunneling models, as described, for example, in the Doctoral Thesis of Blake J. Eliasson, entitled METAL-INSULATOR-METAL DIODES FOR SOLAR ENERGY CONVERSION, University of Colorado (2001), which is incorporated herein by reference. This calculation would yield the differential resistance, $R_2(V)$, for tunneling electrons. In this notation, voltage V is the voltage between the charge pool and metal $M_2$. We should note that $R_2(V)$ may not equal $R_2(-V)$, since the tunneling probability may not be symmetric about V=0. Adding the capacitance, $C_2$, between the charge pool and metal $M_2$, we may construct the simple small-signal model of FIG. 7 from which we may calculate frequency response as $$f_c = \frac{1}{2\pi R_2 \left(\frac{C_1 C_2}{C_1 + C_2}\right)} \tag{19}$$

where the various components are labeled consistent with Equation 19.

With reference to FIG. 2a, in conjunction with FIG. 7, to design a fast varactor, we must minimize $R_2$ and $C_2$. It is recognized that minimizing $I_2$ thickness ($d_2$) and barrier height ($\phi_2$) reduces $R_2$ but increases $C_2$; however, since $R_2$ is exponentially dependent on barrier height and thickness while $C_2$ is only linearly dependent, we will experience a net gain in frequency response by reducing $d_2$ and $\phi_2$. The penalty for reducing these values is reducing the capacitance swing about $V_{th}$ (see FIG. 3).

Realistic material considerations will degrade frequency response from the idealized RC-limited value above. In particular, for amorphous insulator materials, we should expect to encounter localized band tail states, deep trap states, and likely even surface states. Electrons in these states, which extend below the insulator's conduction band "edge", will cause a long-term charging of insulator $I_2$ near the interface with insulator 1, partially shielding the applied voltage and shifting the C(V) curve.

Although each of the aforedescribed physical embodiments have been illustrated with various components having particular respective orientations, it should be understood that the present invention may take on a variety of specific configurations with the various components being located in a wide variety of positions and mutual orientations. For example, as discussed in detail in above incorporated U.S. Pat. No. 6,563,185, other materials may be used in place of metal layers including, but not limited to semiconductors and semi-metals. Furthermore, the methods described herein may be modified in an unlimited number of ways, for example, by reordering the various sequences of which they are made up. Therefore, the present examples are to be considered as illustrative and not restrictive, and the invention is not to be limited to the details given herein but may be modified within the scope of the appended claims.

What is claimed is:

1. A varactor, comprising:
   first and second conducting layers, spaced apart from one another such that a given voltage can be applied across the first and second conducting layers; and
   an insulator arrangement including at least one insulator layer disposed between the first and second conducting layers, configured to cooperate with the first and second conducting layers to produce a charge pool within said insulator layer which changes responsive to changes in said given voltage such that a device capacitance value between the first and second conducting layers changes responsive to said given voltage.

2. The varactor of claim 1 wherein said insulator arrangement is configured such that increasingly biasing the first conducting layer more positive than the second conducting layer, using said given voltage, produces a corresponding increase in said device capacitance value.

3. The varactor of claim 1 wherein said insulator arrangement includes at least a first insulator layer, adjacent to said first conducting layer, and a second insulator layer, adjacent to said second conducting layer and in a side-by-side relationship with said first insulator layer so as to define a boundary therebetween for producing said charge pool in the second one of said insulator layers proximate to said boundary with the first one of the insulator layers.

4. The varactor of claim 3 wherein said first insulator layer includes a first barrier height and said second insulator layer includes a second barrier height, and the first and second barrier heights are selected to produce tunneling of electrons from said second conducting layer through said second insulator layer, responsive to the given voltage, and to inhibit tunneling of electrons across said first insulator layer to generate said charge pool.

5. The varactor of claim 4 wherein said first barrier height is greater than said second barrier height.

6. The varactor of claim 5 wherein said first barrier height is much greater than 1 eV and said second barrier height is less than 0.3 eV.

7. The varactor of claim 3 wherein said first insulator layer includes a first capacitance value and said second insulator layer includes a second capacitance value such that an application of said given voltage which causes the first conducting layer to be increasingly negative with respect to the second conducting layer, below a given threshold value of said given voltage, causes said device capacitance value to approach a series combination of said first capacitance value and said second capacitance value and application of said given voltage which causes the first conducting layer to be increasingly positive with respect to the second conducting layer, above said given threshold value of said given voltage, causes said device capacitance value to approach said first capacitance value of the first insulator layer.

8. The varactor of claim 7 wherein said varactor is configured in a way which sets said threshold value of said given voltage, at least approximately, to zero volts.

9. The varactor of claim 1 wherein said insulator arrangement includes only one layer of an insulation material between said first and second conducting layers and said insulation material includes an insulator barrier height that cooperates with a second layer work function of said second conducting layer to produce a negative barrier height between the insulation material and the second conducting layer, responsive to said given voltage, such that the charge pool is formed in said insulator material proximate to a boundary with the second conducting layer.

10. The varactor of claim 9 wherein said charge pool includes a width that is modulated by changes in said given voltage.

11. The varactor of claim 1 wherein said insulator arrangement includes at least one layer of an amorphous material.

12. The varactor of claim 1 wherein said insulator arrangement is configured to cooperate with said first and second conducting layers to support electron tunneling, responsive to said given voltage, which produces said charge pool within the insulator arrangement, said charge pool storing an amount of charge in the insulator arrangement that changes based on said electron tunneling such that said device capacitance value between the first and second conducting layers changes responsive to said given voltage.

* * * * *